US006365330B1

(12) United States Patent
Leichsenring et al.

(10) Patent No.: US 6,365,330 B1
(45) Date of Patent: Apr. 2, 2002

(54) CONCENTRATE AND AQUEOUS DEVELOPER PRODUCED THEREFROM FOR IMAGEWISE EXPOSED RECORDING MATERIALS

(75) Inventors: Thomas Leichsenring; Mario Boxhorn, both of Mainz; Andreas Elsaesser, Idstein; Thorsten Lifka, Bad Schwalbach; Rudolf Zertani, Bechtolsheim, all of (DE)

(73) Assignee: Agfa-Gevaert AG, Leverkusen (DE)

( * ) Notice: Subject to any disclaimer, the term of this patent is extended or adjusted under 35 U.S.C. 154(b) by 0 days.

(21) Appl. No.: 09/412,341

(22) Filed: Oct. 5, 1999

(30) Foreign Application Priority Data

Oct. 5, 1998 (DE) .......................... 198 45 605

(51) Int. Cl.$^7$ ................................ G03F 7/32
(52) U.S. Cl. .................. 430/331; 430/466; 510/176
(58) Field of Search ................ 430/331, 466; 510/176

(56) References Cited

U.S. PATENT DOCUMENTS

| 4,966,828 A | | 10/1990 | Doenges et al. ............ 430/281 |
| 5,155,011 A | | 10/1992 | Zertani et al. ............. 430/331 |
| 5,155,012 A | | 10/1992 | Joerg et al. ................. 430/331 |
| 5,635,328 A | * | 6/1997 | Higashino et al. .......... 430/166 |
| 5,670,294 A | * | 9/1997 | Piro ........................... 430/331 |

FOREIGN PATENT DOCUMENTS

| DE | 287 529 | 2/1991 |
| EP | 0 135 863 | 4/1985 |
| EP | 0 274 044 | 7/1988 |
| EP | 0 432 450 | 6/1991 |
| EP | 0 432 451 | 6/1991 |
| EP | 0 490 515 | 6/1992 |
| EP | 0 573 805 | 12/1993 |
| EP | 0 720 060 | 7/1996 |
| EP | 0 732 628 | 9/1996 |
| EP | 0 795 787 | 9/1997 |
| JP | 62-187855 | 9/1993 |
| JP | 8-248643 | 9/1996 |

OTHER PUBLICATIONS

Keiji; "Developing Solution Which Can Make Common Processing of Negative Type and Positive Type Photosensitive Lithographic Printing Plate and Developing Process Method Using Said Solution"; Patent Abstracts of Japan; vol. 012, No. 042; Feb. 6, 1988; JP 62 187855; Aug. 17, 1987; Abstract.

* cited by examiner

Primary Examiner—Hoa Van Le
(74) Attorney, Agent, or Firm—Foley & Lardner

(57) ABSTRACT

The invention relates to a developer concentrate which comprises water, at least one agent which is alkaline in water and an amphoteric surfactant and additionally at least one anionic surfactant, at least one complexing agent, at least one aminoalcohol and at least one N-alkoxylated mono- or polyfunctional amine. A ready-to-use developer can be prepared from this concentrate by dilution with tap water advantageously in the ratio of from 1:0.5 to 1:10, preferably in the ratio of from 1:2 to 1:6. The developer or the replenisher is preferably used in the production of printing plates.

29 Claims, No Drawings

CONCENTRATE AND AQUEOUS DEVELOPER PRODUCED THEREFROM FOR IMAGEWISE EXPOSED RECORDING MATERIALS

BACKGROUND OF THE INVENTION

1. Field of the Invention

The present invention relates to a developer concentrate which comprises water, at least one agent which is alkaline in water, and an amphoteric surfactant, and the developer itself which is obtainable by dilution with water and is suitable for imagewise exposed recording materials, such as printing plates, photoresists, copying materials, etc., as well as to a corresponding replenisher, and methods for making developer concentrates and replenishers.

2. Description of the Related Art

The developers known to date have a number of disadvantages. Thus, they often contained significant amounts of organic solvents which are undesired because they constitute a fire hazard and owing to their low boiling point, their unpleasant odor, the pollution of wastewater and waste air and the expensive apparatuses for the safe disposal of the spent developer. They should therefore no longer be present in modem developers.

A large amount of organic solvents is contained by, for example, the aqueous developer concentrates according to EP-A 432 450, U.S. Pat. No. 5,155,011, EP-A 432 451 and U.S. Pat. No. 5,155,012, which can be diluted with tap water to give ready-to-use developers. The concentrates furthermore contain an alkaline agent, an anionic surfactant, salts of an n-alkanoic acid, emulsifiers, alkali metal salts of an oligomeric phosphate and/or N-(2-hydroxyethyl) ethylenediaminetriacetic acid and a buffer. According to EP-A 432 450, the buffer is specified as tris(hydroxyalkyl) aminomethane.

Alkali metal salts of N-(2-hydroxyethyl) ethylenediaminetriacetic acid are known to be poorly biodegradable. German industry has therefore undertaken to reduce the polution of the environment with these substances.

To simplify the cleaning of the developing machines, the developers frequently contain surfactants. However, these often foam to such a great extent that antifoams have to be added. In addition, the foam may result in already detached components of the layer being deposited again on the recording material or in these components being carried into downstream stations (washbath, gumming station) of the developing machine. Already developed recording materials may become useless in this way. It is mainly during development in machines that components of the layer which are contained in the developer in the form of cakes, filaments or pigment residues are deposited on the printing plates.

In continuously operating developing machines, the composition of the developer is kept constant by the continuous addition of fresh developer or of a special replenisher. The required feed intervals can be controlled, for example, by determining the conductivity of the developer. The action of components of the ambient air (oxygen, carbon dioxide) influences the conductivity of the developer to a relatively small extent but has a major effect on the activity of the developer. The conductivity control is consequently not capable of sufficiently compensating a developer whose activity has been reduced by oxidation or carbonate formation after prolonged standing. The result of the development consequently deteriorates.

A process for the production of a lithographic printing plate, in which an imagewise exposed recording material whose back is covered with a layer of an organic polymer is developed with an alkali metal silicate developer, as disclosed in EP-B 490 515. The developer is replenished with an aqueous alkali metal silicate solution in which the molar $[SiO_2]$:$[M_2O]$ ratio is in the range from 0.3 to 1.0 and the $SiO_2$ content is in the range from 0.5 to 4% by weight. The developer and/or the replenisher can moreover contain organic solvents, surfactants and/or antifoams. The surfactants may be anionic, cationic, amphoteric or nonionic.

A developer free of organic solvents intended for positive- and negative-working recording materials is disclosed in JP-A 62-187 855. It contains from 1 to 10% by weight of alkali metal silicate and from 0.1 to 5% by weight of an amphoteric or anionic surfactant.

EP-A 732 628 discloses a developer and a corresponding concentrate which contains nonionic, anionic or amphoteric wetting agents in addition to alkali metal silicates. The developer has a higher developing capacity, results in less foam and has less tendency to cause deposition of layer components on the plates or in the automatic developing units.

In the process for the production of the lithographic printing plate according to JP-A 8-248 643, a recording material having an imagewise exposed, photopolymerized layer is developed with an alkali metal silicate developer. For replenishment, an alkali metal silicate solution is likewise added to the developer. Developer and/or replenisher contain an amphoteric surfactant of the betaine, glycine, alanine or sulfobetaine type. The developer is intended in particular for automatic developing units. The fact that no solid or gel-like precipitates form in this developer during use is stated as a particular advantage.

The developer for positive-working, negative-working or image reversal plates according to EP-A 274 044 contains from 5 to 30% by weight of an alkaline agent, in particular sodium metasilicate, and from 0.01 to 10% by weight of an ethylene oxide/propylene oxide block copolymer. The block copolymer may also be prepared from ethylene oxide, propylene oxide and ethylenediamine. The developer can moreover contain antifoams or softeners.

To prevent precipitates from the developer being deposited on the plates—which, during subsequent printing, result in an undesired ink transfer (known as "scumming") in nonimage areas—the developer according to EP-A 720 060 contains softeners of the alanine type having at least 3 COOA units, in which A=H, Na, K, $NH_4$ or $NR_4$ (R=alkyl).

SUMMARY OF THE INVENTION

However, it remains one object to provide a developer which is suitable for imagewise exposed, positive-working, negative-working or image reversal reproduction layers, has a high developing capacity (as far as possible higher than that of known developers), and at the same time does not tend to form undesired deposits on the already developed plates, or in the developing units. The developer should furthermore, preferably be capable of being brought onto the market in the form of a developer concentrate or replenisher concentrate in order to reduce transport and storage capacities. The ready-to-use developer or the ready-to-use replenisher can then be prepared from the concentrate by dilution with (tap) water. On the other hand, many known developers must from the outset be provided in dilute form since the corresponding concentrates separate over a shorter or longer time and/or form precipitates, particularly at low storage temperatures.

These and other objects can be achieved by a developer concentrate which comprises water, at least one agent which is alkaline in water, an amphoteric surfactant, at least one anionic surfactant, at least one complexing agent, at least one amino alcohol, and at least one N-alkoxylated mono- or polyfunctional amine.

Additional objects, features and advantages of the invention will be set forth in the description which follows, and in part will be obvious from the description, or may be learned by practice of the invention. The objects, features and advantages of the invention may be realized and obtained by means of the instrumentalities and combinations particularly pointed out in the appended claims.

DETAILED DESCRIPTION OF PREFERRED EMBODIMENTS

The agent which is alkaline in water is preferably an alkali metal, an alkaline earth metal or ammonium hydroxide, in particular LiOH, KOH or NaOH, or an alkali metal, alkaline earth metal or ammonium salt of an inorganic or organic acid, in particular sodium hydrogen phosphate or potassium dihydrogen phosphate, disodium hydrogen phosphate or dipotassium hydrogen phosphate, sodium metasilicate or potassium metasilicate, sodium borate, an alkali metal salt of an aliphatic, aromatic or araliphatic carboxylic acid, in particular an alkali metal salt of a $(C_2-C_{10})$alkanoic acid or of a $(C_3-C_{12})$alkoxyalkanoic acid.

The amount of the alkaline agent is advantageously in general from 0.5 to 25% by weight, preferably from 0.7 to 15% by weight, based in each case on the total weight of the concentrate. The pH of the concentrate is in general advantageously at least 11, preferably at least 12.

The amphoteric surfactant is preferably an amino acid or a salt thereof or an alkylamidoalkylbetaine of the formula $$C_nH_{2n+1}\text{—CO—NH—}C_mH_{2m}\text{—}N^+((C_1\text{–}C_6)\text{alkyl})_2\text{—}C_pH_{2p}\text{—}X^-$$

wherein $X^-$ is a carboxylate, sulfonate, sulfate or phosphonate group, n is an integer from 8 to 25 and m, p are an integer from 2 to 10.

The alkylamidoalkylbetaines can be prepared for example, from fatty acids $C_nH_{2n+1}$—COOH, which are first reacted with N,N-dialkyl-substitituted diamines of the formula $H_2N$—$C_mH_{2m}$—$N((C_1\text{–}C_6)\text{alkyl})_2$ to give the corresponding amides. The tertiary amino group can then be quaternized with compounds which may contain or form at least anionic groups. The amino acid and the amino acid salt preferably correspond to the formulae

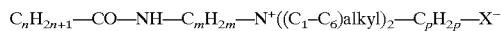

$$R^2R^3N\text{—}R^1\text{—}COOR^4 \text{ or } R^2R^3N\text{—}R^1\text{—}NR^5\text{—}R^7\text{—}COOR^4$$

wherein $R^1$ and $R^7$ are identical or different and are a straight-chain or branched $(C_1-C_{18})$alkylene group in which individual methylene groups may be replaced by oxygen atoms, $R^2$ and $R^3$ are identical or different and are a hydrogen atom or a $(C_1-C_{22})$alkyl group in which individual $CH_2$ groups may be replaced by oxygen atoms or NH groups, or are a carboxy $(C_1-C_{22})$alkyl group whose carboxyl group may also be present as a lithium, sodium, potassium or ammonium carboxylate group, a $(C_2-C_{22})$alkenyl group, an unsubstituted or substituted $(C_4-C_8)$cycloalkyl group or a $(C_2-C_{23})$alkanoyl group, $R^4$ is a hydrogen, lithium, sodium or potassium atom or an ammonium group of the formula $NR_4$, in which R is a hydrogen atom, a $(C_1-C_{10})$alkyl group, a $(C_6-C_{14})$aryl group, a $(C_7-C_{20})$aralkyl group or an aryl group substituted by one or more $(C_1-C_6)$alkyl groups, where each of these groups may furthermore be unsubstituted or substituted by one or more hydroxyl groups, and $R^5$ is a hydrogen atom or a $(C_1-C_{22})$alkyl group in which individual $CH_2$-groups may be replaced by oxygen atoms or NH groups, or is a $(C_2-C_{10})$hydroxyalkyl, a $(C_1-C_{22})$alkenyl- or a $(C_2-C_{23})$alkanoyl group.

Preferred amphoteric surfactants also include betaines of the formula

$$R^2R^3N\text{—}R^1\text{—}N^+R^5R^6R^7\text{—}COO$$

in which $R^1$ to $R^3$ have the abovementioned meaning and $R^5$ and $R^6$ are identical or different and are a hydrogen atom, or a $(C_1-C_{22})$alkyl group in which individual $CH_2$-groups may be replaced by oxygen atoms or NH groups, or are a $(C_1-C_{22})$alkenyl group or a $(C_2-C_{23})$ alkanoyl group, it also being possible for $R^5$ and $R^6$ together to form a ring.

The amount of the amphoteric surfactant is in general advantageously from 0.3 to 25% by weight, preferably from 0.5 to 15% by weight, based in each case on the total weight of the concentrate.

The anionic surfactant is preferably a $(C_2-C_{16})$ alkylsulfate, $(C_6C_{12})$aryl-sulfate, $(C_7-C_{20})$aralkylsulfate, $(C_1-C_{15})$alkyl-$(C_6-C_{12})$arylsulfate, $(C_2-C_{16})$alkenyl-sulfate or $(C_3-C_{16})$alkoxyalkylsulfate. The compounds are unsubstituted or substituted. Examples thereof are octylsulfate, cumenesulfate and castor oil sulfate. Instead of the sulfates, it is of course also possible to use the corresponding sulfonates or carboxylates. The anionic surfactants can also have a plurality of identical or different anionic groups. For example, alkoxyalkyldicarboxylates may be mentioned here. The amount of the anionic surfactants is in general advantageously from 0.5 to 20% by weight, preferably from 1 to 15% by weight, based in each case on the total weight of the concentrate.

The complexing agent is preferably gluconic acid, an alkali metal, alkaline earth metal or ammonium salt of gluconic acid or the delta-lactone of gluconic acid. These complexing agents have the further advantage that they are particularly environmentally friendly (they are even used in foods) and readily biodegradable. In addition, even small amounts thereof (such as from 2 to 5% by weight, based on the total weight of the concentrate) result in very considerable softening. Furthermore, polyphosphates, alanine derivatives or ethylenediamine derivatives, particularly EDTA derivatives, may be mentioned as suitable complexing agents. The amount of the complexing agents is in general advantageously from 2 to 20% by weight, preferably from 4 to 15% by weight, based in each case on the total weight of the concentrate.

The aminoalcohol is suitably in general a primary, secondary or tertiary aliphatic amine having at least one, preferably from 2 to 5, hydroxyl groups, preferably primary or secondary hydroxyl groups. As a rule, it comprises not more than 60 carbon atoms. These include, for example, 2-hydroxy-1,1-bis-hydroxymethylethylamine (tris (hydroxymethyl)-aminomethane) and triethanol-amine.

The N-alkoxylated, mono- or polyfunctional amine is preferably an ethoxylated orpropoxylated $(C_1-C_{10})$ alkylamine, $(C_2-C_{10})$alkylenediamine, triamine or tetraamine. These include, for example, ethylenediamines which have been reacted with ethylene oxide and/or propylene oxide. The alkoxylated amino groups preferably contain one or 2 chain(s) (each) comprising 2 to 25 alkylene oxide units. The amount of the N-alkoxylated, mono- or polyfinctional amines is from 0.2 to 20% by weight, preferably from 0.4 to 10% by weight, based in each case on the total weight of the concentrate.

The developer concentrate according to the invention can moreover contain further components, depending on the type of the recording materials to be developed. These include in particular aliphatic or aromatic alcohols, especially ($C_1$–$C_{12}$)alkanols, ($C_3$–$C_{20}$)alkoxyalkanols, unsubstituted or substituted phenol or benzyl alcohol. They also include nonionic surfactants, preferably alkoxylated (especially ethoxylated or propoxylated), saturated or unsaturated aliphatic or aromatic alcohols. The amount of the nonionic surfactants is in general advantageously from 0.1 to 20% by weight, preferably from 0.5 to 12% by weight. Finally, cationic surfactants may also occur in the concentrate.

The concentrate can be diluted with tap water in any ratio such as from 1:0.5 to 1:10, preferably in the ratio of from 1:2 to 1:6, to give a ready-to-use developer.

The present invention also relates to a replenisher concentrate. This concentrate differs from the developer concentrate for example, in that the concentration therein of the at least one agent which is alkaline in water can be, for example, from 10 to 700%, preferably from 50 to 300%, higher than in the developer concentrate and also the concentrations of the other components may differ from those of the developer concentrate by up to 70%, preferably up to 50%. The ready-to-use replenisher can be prepared from the replenisher concentrate likewise by dilution with tap water in a ratio for example, from 1:0.5 to 1:10, preferably in the ratio of from 1:2 to 1:6. The replenisher can be added to a partly spent developer in order to restore its fill activity if desired.

On dilution with the tap water which contains permanent hardness formers (in particular magnesium or calcium ions), preferably no precipitates or insoluble components are formed. Such precipitates can impair the operation of the developing machine and may be deposited on the printing plates, which leads to problems with the ink acceptance during printing.

The developer according to the invention is suitable for most of the positive-working, negative-working or image reversal recording materials on the market, in particular for those whose reproduction layer is also provided with one or more water-soluble or water-dispersible top coats. A sizeable advantage of the developer according to the invention is its particularly high developing capacity. The consumption of developer per square meter of recording material thus decreases substantially, so that the developer has to be replenished less frequently. The number of developer changes can be reduced by about a half, depending on the addition of replenisher. The stoppage of production is thus avoided and the work involved is also reduced. Furthermore, the developing apparatuses can be cleaned by simply washing out with water. Special cleaning agents are no longer required. The cleaning agents used to date for this purpose are as a rule dangerous, environmentally harmful and expensive. Deposits onto the developed plates are not observed when employing the inventive developer concentrate. It is therefore also typically no longer necessary to provide special filters or other apparatuses for separating off solid components in the developing machines.

The inclusion of N-alkoxylated, mono- or polyfunctional amines allow the developer to foam only to a slight extent and at the same time to have an emulsifying effect on the layer components from the recording material. Although the foam formation can also be suppressed by adding antifoams, in the event of an incorrect dose, there may be a high risk that the recording material will be damaged and poor results will be obtained on printing. Conventional antifoams, for example, silicone emulsions, furthermore often decline in their activity in alkaline media over time. The use of antifoams is therefore almost always associated with greater work in terms of monitoring the production process. The developers according to the invention can generally be used in all known developing apparatuses, for example in emulsion bath machines, flat table machines having rotating or oscillating brushes or (high-pressure) spray developing machines. On the other hand, it was frequently required to date to use special developing apparatuses in which the brushes are encapsulated or completely surrounded by developer in order to avoid undesired foam formation. In addition, it was often necessary to lay the feed lines for the developer under the liquid level, to keep the developer in a special forced circulation or to provide the developing zone with a special cover.

With the developer according to the invention, it is possible to develop a multiplicity of imagewise exposed reproduction layers. These layers can contain, any radiation-sensitive components, for example, diazonium salt polycondensates, quinonediazide compounds, preferably ortho-quinonediazides, combinations of polymerizable, ethylenically unsaturated monomers and photopolymerization initiators and/or combinations of acid-cleavable compounds and compounds which form acid on exposure to radiation. In addition, polymeric binders, plasticizers, sensitizer dyes, other dyes or pigments, control substances, irradiation indicators, surfactants and/or wetting agents may be added if desired.

Particularly suitable binders in radiation-sensitive layers include polymers which are insoluble in water but soluble or at least swellable in organic solvents and in aqueous alkaline solutions. Polymers having pendant carboxyl groups are particularly suitable, for example, copolymers having units of (meth)acrylic acid, crotonic acid or maleic monoesters or polymers having hydroxyl groups, some or all of which have been reacted with cyclic dicarboxylic anhydrides. The polymeric binders generally have a molecular weight $M_w$ of from 500 to 1,000,000, in particular from 1000 to 200,000, and an acid number of from 10 to 250, preferably from 20 to 200. Preferred binders include copolymers of (meth)acrylic acid, of crotonic acid or of vinylacetic acid. Suitable comonomers include, in particular, alkyl(meth)acrylates, hydroxyalkyl (meth)acrylates, allyl (meth)acrylates, aryl (meth)acrylates and/or (meth)acrylonitrile. Copolymers of maleic anhydride and unsubstituted or substituted styrenes, unsaturated hydrocarbons, unsaturated ethers or esters may also be mentioned. The anhydride groups contained therein may also be esterified. The amount of the binders in the radiation-sensitive mixture is in general advantageously from 20 to 90% by weight, preferably from 40 to 80% by weight.

The monomers in the photopolymerizable mixtures include in general ethylenically unsaturated compounds, in particular acrylates or methacrylates of dihydric or polyhydric alcohols. Ethylene glycol di(meth)acrylate, diethylene glycol di(meth)acrylate, (meth)acrylates of trimethylolethane, trimethylolpropane, pentaerythritol, dipentaerythritol and of polyhydric alicyclic alcohols may be mentioned specifically. The reaction products of mono- or diisocyanates with partial esters of polyhydric alcohols can also advantageously be used. Finally, polymerizable compounds which additionally contain photooxidizable groups, if required also urethane groups, are also suitable. The photooxidizable groups are in general amino, urea or thio groups which may also be part of heterocyclic rings. Especially suitable photooxidizable groups are triethanolamino, triphenylamino, thiourea, imidazole, oxazole, thiazole, acetylacetonyl, N-phenylglycine and ascorbic acid groups. Among these, the polymerizable compounds having primary or secondary but in particular tertiary amino groups are preferred.

The photoinitiators can be selected from a number of classes of substances. In particular, derivatives of benzophenone, of acetophenone, of benzoin, of benzil, of fluorenone, of thioxanthone, of acridine or of quinazoline and of polynucleic quinones may be mentioned. Trichloromethyl-s-triazines, 2-halomethyl-5-vinyl-[1,3,4] oxadiazole derivatives, halooxazoles substituted by trichloromethyl groups and carbonyl methylene heterocycles containing trihalomethyl groups (EP-A 135 863 and U.S. Pat. No. 4,966,828) also deserve mention. Finally, alkylbisacylphosphine oxides, alkylarylbisacylphosphine oxides, titanocenes, ferrocenes, azidosulfonylphenylphthalimides, ketoxime ethers, and onium compounds (especially diaryliodonium, diazonium or sulfonium compounds) are also suitable.

The radiation-sensitive layer may contain, as sensitizer dyes, in particular photoreducible xanthene, fluorene, benzoxanthene, benzothioxanthene, thiazine, oxazine, coumarin, pyronine, porphyrin, acridine, azo, disazo, cyanine, merocyanine, diarylmethyl, triarylmethyl, anthraquinone, phenylenediamine, benzimidazole, fluorochrome, quinoline, tetrazole, naphthol, benzidine, rhodamine, indigo and/or indanthrene dyes. The amount of the sensitizer dyes is in general advantageously from 0.01 to 15%, preferably from 0.05 to 5% by weight, based in each case on the total weight of the nonvolatile components of the radiation-sensitive layer.

In order to increase the photosensitivity further, the layer may additionally contain coinitiators. For example, the combination of titanocenes and trichloromethyl-s-triazines, of titanocenes and ketoxime ethers and of acridines and trichloromethyl-s-triazines is known. A further increase in sensitivity can be achieved by adding dibenzalacetone or amino acid derivatives. The amount of the initiator or initiators or coinitiator or coinitiators is in general from 0.01 to 20% by weight, preferably from 0.05 to 10% by weight, based in each case on the total weight of the nonvolatile components of the radiation-sensitive layer.

Dyes or pigments may be added for coloring the radiation-sensitive layer. In general, phthalocyanine, rhodamine, triarylmethane, azo, disazo, anthraquinone, naphthol or phenylenediamine dyes or inorganic colored pigments are used for this purpose.

In order to establish specific properties, inhibitors and control substances may furthermore be present in the layer. These include for example, benzophenone compounds, phosphorus compounds, cycloacetals, quinones, quinolines, naphthoquinones, anthraquinones, ethers, sterically hindered amines, benzothiazols, thiurams, thiocarbamates, phenols, naphthols, benzimidazoles, mercaptobenzimidazoles and phenylenediamines. The amount of the inhibitors and/or control substances is in general advantageously from 0.001 to 10% by weight, preferably from 0.005 to 5% by weight, based in each case on the total weight of the nonvolatile components of the radiation-sensitive layer.

Any topcoats present in the recording materials comprise or essentially comprise water-soluble or water-emulsifiable polymeric binders. They may also contain wetting agents, adhesion promoters, antifoams, dyes and other assistants. Such topcoats are likewise known to those skilled in the art.

The developer according to the present invention is primarily suitable and/or intended for the production of printing plates for lithographic printing, letterpress printing, gravure printing or screen printing, and also of photoresist images. However, it can also be used in the production of relief copies (for example of texts in Braille), of tanned images or pigmented images.

The support in said printing plates preferably consists of metal, in particular of aluminum, steel, zinc, copper or metal alloys, plastic, in particular polyethylene terephthalate (PET), cellulose acetate or polyamide (PA). Supports for screens consist in particular of Perlon gauze. In the case of photoresists, the support is generally a silicone wafer.

The surface of the supports is in many cases pretreated. Thus, aluminum supports are frequently mechanically and/or chemically and/or electrochemically roughened, anodically oxidized and/or hydrophilized by known methods. Such pretreatments result in the reproduction layer adhering better thereon, so that lithographic properties of the support—in particular its water acceptance and water retentivity—are improved or so that the support reflects to a lesser extent during the imagewise exposure (antihalation). The same effect can be achieved by applying to the support special layers which comprise, for example, binders, pigments and, if required, additives.

The radiation-sensitive recording materials can be prepared by any processes which are known per se to the person skilled in the art. In general, the components of the radiation-sensitive layer can be dissolved or dispersed in an organic solvent or solvent mixture, the solution or dispersion can be applied to the intended support in any way such as by pouring on, spraying on, emersion, roll application or in a similar manner and the solvents are removed during subsequent drying.

The imagewise exposure to radiation can be effected for example by means of tubular, pulsed xenon lamps, xenon arc lamps, metal halide-doped high-pressure mercury vapor lamps and carbon arc lamps. In addition, the exposure to light is possible in conventional projection and enlargement units for the light of the metal filament lamps and with contact exposure to customary tungsten filament lamps. Imagewise exposure can also be effected using coherent light of a laser. Lasers of suitable power, for example, argon ion lasers, crypton ion lasers, dye lasers, solid-state lasers, helium-cadmium lasers and helium-neon lasers, which emit in particular between 250 and 1100 nm, particularly between 400 and 700 nm, are suitable. The laser beam can be controlled in any manner such as by a specified program and the exposure can be performed by movements along the lines or along the grid.

The invention also relates to a process for the production of a printing plate, wherein a positive-working, negative-working or image reversal reproduction layer is applied to a support, preferably of aluminum or alloys thereof, which is in particular mechanically and/or chemically and/or electrochemically pretreated and/or hydrophilized, and the reproduction layer is exposed imagewise and then is developed with a developer which is prepared by diluting the concentrate according to the invention with water.

The invention is explained in more detail by the following examples without restricting it thereto. Unless stated otherwise, parts by weight (pbw) and parts by volume (pbv) bear the same relation as that of g to ml. Percentages and ratios are to be understood as weight units.

EXAMPLES

Photopolymer printing plates®Ozasol N90A from Agfa-Gevaert AG were exposed in a Polaris 100 laser exposure unit from Strobbe identically at 3 steps with a maximum density of a gray scale with a step density difference $\Delta D=0.15$. Thereafter, the printing plates were thermally treated for about 5 s at 100° C. The printing plate N90A is a two-layer plate which has a photosensitive photopolymer layer and a water-soluble protective layer on a hydrophilized lithographic aluminum support.

Example 1

The printing plates are processed in a VSO 85 processing machine from Glunz and Jensen. The developers in Table 1 were each introduced into the developing machine, pumped onto the plate surface through nozzles and distributed by an oscillating brush. The soluble printing plate components were rubbed out. After each 20m² of unexposed printing plate material N90A, an exposed plate was processed. Replenishment was effected by the top-up method with the corresponding developer at 30 ml/m².

TABLE 1

| | Developer No. | | | | | | | | | |
|---|---|---|---|---|---|---|---|---|---|---|
| | 1 | 2 | 3 | 4 | 5 | 6 | 7 | 8 | 9 | 10 |
| | | | | | according to | | | | | |
| Raw material | EP-A 573805 | JP-A 08-248643 | EP-A274044 | EP-A432450 | Invention | Invention | Invention | Invention | Invention | Invention |
| | | | | | Amount in parts by weight | | | | | |
| Trisodium citrate x 2H$_2$O | 1 | | | | | | | | | |
| 1-Aminopropan-2-ol | 2 | | | | | | | | | |
| Trishydroxymethyl-aminomethane | | | | 0.4 | 0.2 | 0.2 | 0.2 | 0.2 | 0.2 | 0 2 |
| Benzyl alcohol | 1.4 | | | | | | | | | |
| Phenoxyethanol | | | | 1.6 | | | | | | |
| Pelargonic acid | | | | 1.54 | | | | | | |
| Sodium cumenesulfonate | 1.5 | | | | 0.9 | | 0.9 | 0.9 | 0.9 | 0.9 |
| Castor oil sulfate | | | | | | | | | | |
| Octylsulfate | | | | | | | | 0.5 | | |
| Phenylsulfonate | | | | 0.8 | | | | | | |
| Sodium metasilicate x 5H$_2$O | 0.04 | | 15 | 1 | 1.25 | 1.25 | 1.25 | | | |
| Potassium metasilicate | | 2.4 | | | 2.5 | 2.5 | | | | |
| Borax | | | 2 | | | | | | | |
| Potassium tripolyphosphate | | | | 0.8 | | | | | | |
| Sodium dihydrogenphosphate | | | | 0.27 | | | | | | |
| Fatty alcohol polyglycol ether | 0.02 | | | | | | | | | |
| Poly(N-vinyl-N-methyl-acetamide-co-di-2-ethylhexyl maleate) | | | | 0.8 | | | | | | |
| Tetrasodium ethylene-diaminetetraacetate | 0.03 | 1 | | | | | | | | |
| Triethanolammonium-arylphenol ethoxy phosphate | | 1 | | | | | | | | |
| Sodium gluconate | | | | | 1.25 | 1.25 | 1 | 3.75 | 1.25 | 0 |
| Alkyl (C$_{12}$–C$_{14}$) alanine-amphotenside 100% | | 1.04 | | | 1 | 0.8 | 1.25 | 3.75 | 1.25 | |
| Potassium hydroxide | | 0.05 | | | 0.3 | 0.3 | 0.15 | 0.5 | 0.5 | 0.5 |
| Sodium hydroxide | | | | 0.4 | | | | | | |
| Cobalt acetate | | 0.001 | | | | | | | | |
| Silicon antifoam RC 31 | | 0.001 | | 0.004 | | | | | | |
| Amine ethoxylate | | | 0.02 | | | | | | | |
| Ethytenediamine-propoxy-co-ethyloxylate (15 EO-PO) | | | 0.2 | | | | | | | |
| Ethylenediamine ethoxylate (11 C$_2$H$_4$O units each) | | | | | 0.2 | 0.2 | 0.2 | 1.25 | 1.25 | 1.25 |
| Water | 94.04 | 92 | 83.98 | 92.986 | 89.35 | 90.25 | 94 | 93.4 | 90.9 | 94.65 |

The developers were assessed according to the achievable developing capacity of exposed printing plates. The experiment was terminated after the first redeposits were found on the printing plate.

TABLE 2

| Developer | Redeposit after | Cleaning | Remark |
|---|---|---|---|
| 1 | 90 m$^2$ | tacky sediment, removable only with special cleaner | |
| 2 | termination after 20m$^2$ owing to considerable foam formation | can be easily washed out with water, high water requirement owing to foam formation | addition of up to 0.1% of antifoam RC31 did not result in sufficient defoaming |
| 3 | 110 m$^2$ | tacky residues, removable only with special cleaner | highly corrosive attack on the rollers, metal parts and aluminum of the printing plates |
| 4 | 60 m$^2$ | highly tacky residues removable only with acid-containing cleaner | |
| 5 | 150 m$^2$ | sediment easy to loosen and to wash out with a water jet | |
| 6 | 170 m$^2$ | washing out with water | |
| 7 | 140 m$^2$ | sediment can be loosened and washed out with a water jet | |
| 8 | 140 m$^2$ | sediment can be loosened and washed out with a water jet | |
| 9 | 170 m$^2$ | sediment can be easily washed out | |
| 10 | 150 m$^2$ | sediment can be loosened and easily washed out with a water jet | pH slightly lower |

Example 2

The printing plates were processed in a VSC 85 processing machine from Technigraph Ltd. For this purpose, the developers in Table 1 were each introduced into the developing machine, in which the developing zone was in the form of an emersion bath, so that the printing plates were passed through the developer liquid during the development process. Spray tubes in the developer bath ensured developer application with circulation. Two rotating brushes rubbed out the soluble printing plate components.

After every 20 m$^2$ of unexposed printing plate material N90A, an exposed plate was processed. Replenishment was effected by the top-up method with the corresponding developer at 30 ml/m$^2$. The developers were assessed according to the achievable developing capacity of exposed printing plates. The experiment was terminated after the first redeposits of layer residues were found on the printing plate.

TABLE 3

| Developer | Redeposits after | Cleaning | Remark |
|---|---|---|---|
| 1 | 220 m$^2$ | tacky sediment, removable only with special cleaner | additional cleaning operation with acidic cleaner |
| 2 | 120 m$^2$ | can be easily washed out with water, high water requirement owing to foam formation | stain visible at 120 m$^2$ |
| 3 | 130 m$^2$ | tacky residues, removable only with special cleaner | highly corrosive attack on the rollers, metal parts and aluminum of the printing plates |
| 4 | 120 m$^2$ | highly tacky residues removable only with acid-containing cleaner | |
| 5 | 300 m$^2$ | sediment can be easily loosened and can be washed out with water | |
| 6 | 350 m$^2$ | sediment can be easily loosened and can be washed out with water | |
| 7 | 280 m$^2$ | sediment can be loosened with a brush | |

TABLE 3-continued

| Developer | Redeposits after | Cleaning | Remark |
|---|---|---|---|
| 8 | 240 m² | and can be washed out with a water jet sediment can be loosened with a brush and can be washed out with a water jet | |
| 9 | 260 m² | sediment can be loosened with a brush and can be washed out with a waterjet | |
| 10 | 350 m² | sediment can be easily washed out with a water jet | |

Example 3

All developers in Table 1 were subjected to a foam test. For this purpose, 20 ml of the developer were introduced into a closable 100 ml measuring cylinder, while avoiding foam formation, and were shaken 5 times in 5s. The foam height was read as the difference between liquid level and foam crown after 5, 10 and 15 minutes.

TABLE 4

| | Foam height in ml | | |
|---|---|---|---|
| Developer | 5 min | 10 min | 15 min |
| 1 | 35 | 30 | 30 |
| 2 | 79 | 79 | 79 |
| 3 | 29 | 29 | 29 |
| 4 | 27 | 23 | 23 |
| 5 | 45 | 42 | 41 |
| 6 | 37 | 32 | 32 |
| 7 | 50 | 40 | 36 |
| 8 | 42 | 42 | 41 |
| 9 | 45 | 36 | 33 |
| 10 | 39 | 37 | 32 |

Example 4

All developers in Table I were subjected to a freezing test. For this purpose, 100 ml of the developer were frozen for 24 hours at −20° C. and then thawed again. The assessment was carried out after warming up to room temperature (about 25° C.).

TABLE 5

| Developer | Assessment after thawing |
|---|---|
| 1 | turbid, 2 phases |
| 2 | clear solution, floating crystalline particles, haze formation |
| 3 | 3 phases, turbid 2nd phase |
| 4 | clear solution, no phase formation |
| 5 | clear solution, no phase formation |
| 6 | clear solution, no phase formation |
| 7 | clear solution, no phase formation |
| 8 | clear solution, no phase formation |
| 9 | clear solution, no phase formation |
| 10 | clear solution, no phase formation |

Example 5

The developers in Table 1 were prepared as concentrates with a 5-fold solids concentration and were made up to 100 pbw with demineralized water. Thereafter, the concentrates were subjected to the freezing test. In the dilution test, 1 pbw of developer from the freezing test was mixed with 4 pbw of tap water with 12° dH (12 degrees of Gennan hardness) and the formation of precipitates or phases was observed.

TABLE 6

| | 5-fold concentrate | | |
|---|---|---|---|
| Developer | Solubility | Freezing test | Dilution test |
| 1 | clear solution | clear solution | turbid solution, sediment settles out, 2 phases |
| 2 | clear solution | 2 phases | haze formation |
| 3 | not completely soluble | not applicable | not applicable |
| 4 | clear solution | floating flocs, 2 phases with turbidity in the 2nd pbase | clear solution |
| 5 | clear solution | clear solution | clear solution |
| 6 | clear solution | ciear solution | clear solution |
| 7 | clear solution | clear solution | clear solution |
| 8 | clear solution | clear solution | clear solution |
| 9 | clear solution | clear solution | clear solution |
| 10 | clear solution | clear solution | solution becomes turbid, precipitate |

Example 6

By way of comparison, exposed printing plates N90A were developed in the developers in Tables 1 and 7 in a laboratory developing machine having two oscillating brushes and a throughput speed of 0.6 m/min and the developed plates were sprayed off manually with water. The steps of the scale were measured by means of a reflectance densitometer D19C from Gretag. The sensitivity was stated in scale steps with the same density with a maximum deviation in terms of density difference of $\Delta D=\pm 0.02$. The stain was measured on the layer-free parts of a coated, exposed and developed printing plate in comparison with an uncoated printing plate support; here, a density tolerance of $\Delta D=\pm 0.02$ was likewise applicable.

TABLE 7

| Raw material | Developer No. | | | | | |
|---|---|---|---|---|---|---|
| | 11 | 12 | 13 | 14 | 15 | 16 |
| | Amount in parts by weight | | | | | |
| Triethanolamine | | 0.3 | 0.3 | 0.3 | 0.3 | 0.3 |
| Sodium cumenesulfonate | 1.5 | 1.5 | 1.5 | 1.5 | 1.5 | 1.5 |
| Castor oil sulfate | 1.5 | 1.5 | 1.5 | 1.5 | 1.5 | 1.5 |
| Sodium metasilicate × $5H_2O$ | 0.04 | 0.04 | 0.04 | 0.04 | 0.04 | 0.04 |
| Sodium salt of 2-[(2-($C_8$–$C_{10}$)alkanoylamino-ethyl)-(2-hydroxyethyl)amino]acetic acid | | 0.9 | | | | |
| Trisodium salt of N-(2-carboxymethoxyethyl)-N'-cocosalkanoylethylenediamine-N,N'-diacetic acid | | | 0.9 | | | |
| L-Glutamic acid | | | | | | 0.9 |
| Sodium salt of N-(2-carboxyethyl)-N-(2-ethyl-hexyl)-β-alanine (amphotenside EH) | | | | 0.9 | | |
| 6-Aminocaproic acid | | | | | 0.9 | |
| Alkyl($C_{12}$–$C_{14}$)alanine amphotenside 100% | 1.2 | | | | | |
| Sodium gluconate | 1.25 | 1.25 | 1.25 | 1.25 | 1.25 | 1.25 |
| Potassium hydroxide | 0.3 | 0.3 | 0.3 | 0.3 | 0.3 | 0.3 |
| Ethylenediamine ethoxylate (11 $C_2H_4O$ units each) | 0.2 | 0.2 | 0.2 | 0.2 | 0.2 | 0.2 |
| Water | 94.01 | 94.01 | 94.01 | 94.01 | 94.01 | 94.01 |

The developers 1 and 5 to 14 gave a similar development result and the developed plates do not differ in terms of measurement. Developer 2 did not develop the plate sufficiently well and developer 3 left an undesired stain. Developer 4 developed the plate to a greater extent than the other developers. To obtain the same exposure result as the comparative developer, this plate had to be exposed for longer or with greater intensity.

Example 7

Positive-working printing plates ®Ozasol P51 were exposed in a UV exposure frame through an UGRA offset test wedge 1982 under an iron-doped high-pressure mercury lamp for 100 cycles so that, after the development with an ®Ozasol EP260 developer, two steps were free. Further test plates were exposed in the same manner but developed with the developers 17 to 22 according to Table 9. The development results were just as good and in particular the gradation was virtually identical.

TABLE 8

| Developer | Scale steps | Stain |
|---|---|---|
| 1 | 3 | no |
| 2 | 4 | no |
| 3 | 3 | yes |
| 4 | 2 | no |
| 5 | 3 | no |
| 6 | 3 | no |
| 7 | 3 | no |
| 8 | 3 | no |
| 9 | 3 | no |
| 10 | 3 | no |
| 11 | 3 | no |
| 12 | 3 | no |
| 13 | 3 | no |
| 14 | 3 | no |
| 15 | 3 | no |
| 16 | 3 | no |

TABLE 9

| Raw material* | Developer No. | | | | | |
|---|---|---|---|---|---|---|
| | 17 pbw | 18 pbw | 19 pbw | 20 pbw | 21 pbw | 22 pbw |
| 5 | 100 | | | | | |
| 6 | | 100 | | | | |
| 7 | | | 100 | | | |
| 8 | | | | 100 | | |
| 9 | | | | | 100 | |
| 10 | | | | | | 100 |
| Sodium metasilicate | | | | 5 | 6 | 6 | 6 |
| Potassium metasilicate | 5 | 5 | | | | |

*The numbers in column 1 relate to the developers according to Table 1.

Example 8

Howson ®Alympia positive-printing plates were exposed as in Example 7. The exposed plates were then stored for 2 min at 145° C. in a forced-draft drying oven. Image reversal was brought about in this manner. The development of the printing plates treated in this manner was also carried out as in Example 7. The results, too, corresponded to those in Example 7.

The priority document, German Patent Application No. 198 45 605.0, filed Oct. 5, 1998 is incorporated herein by reference in its entirety.

All documents referred to herein are incorporated herein by reference in their entireties.

We claim:

1. A developer concentrate consisting essentially of:
    water,
    at least one agent which is alkaline in water,
    an amphoteric surfactant,
    at least one anionic surfactant,
    at least one complexing agent, wherein the complexing agent is gluconic acid, an alkali metal, alkaline earth metal or ammonium salt of gluconic acid or the delta-lactone of gluconic acid,
    at least one amino alcohol, and
    at least one N-alkoxylated mono- or polyfunctional amine.

2. A developer concentrate as claimed in claim 1, wherein the agent which is alkaline in water comprises (i) an alkali metal, an alkaline earth metal, or ammonium hydroxide, (ii) an alkali metal, alkaline earth metal or an ammonium salt of an inorganic or organic acid, and/or (iii) an alkali metal salt of an aliphatic, aromatic or araliphatic carboxylic acid.

3. A developer concentrate as claimed in claim 2, wherein the amount of the alkaline agent is from 0.5 to 25% by weight, based on the total weight of the concentrate.

4. A developer concentrate as claimed in claim 1, wherein the pH is at least 11.

5. A developer concentrate as claimed in claim 1, wherein the amphoteric surfactant is an amino acid or a salt thereof, or an alkylamidoalkylbetaine of the formula

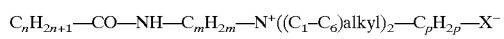

wherein $X^-$ is a carboxylate, sulfonate, sulfate or phosphonate group, n is an integer from 8 to 25 and m, p are each an integer from 2 to 10.

6. A developer concentrate as claimed in claim 5, wherein the amount of the amphoteric surfactant is from 0.3 to 25% by weight, based on the total weight of the concentrate.

7. A developer concentrate as claimed in claim 5, wherein the anionic surfactant is an unsubstituted or substituted $(C_2-C_{16})$alkylsulfate, $(C_6-C_{12})$-arylsulfate, $(C_7-C_{20})$ aralkylsulfate, $(C_1-C_{15})$alkyl-$(C_6-C_{12})$arylsulfate, $(C_2-C_{16})$-alkenylsulfate or $(C_3-C_{16})$alkoxyalkylsulfate.

8. A developer concentrate as claimed in claim 7, wherein the amount of the anionic surfactant is from 0.5 to 20% by weight, based on the total weight of the concentrate.

9. A developer concentrate as claimed in claim 1, wherein the amount of the complexing agent is from 2 to 20% by weight, based on the total weight of the concentrate.

10. A developer concentrate as claimed in claim 1, wherein the aminoalcohol is a primary, secondary or tertiary aliphatic amine having at least one hydroxyl group.

11. A developer concentrate as claimed in claim 1, wherein the N-alkoxylated, mono- or polyfunctional amine is an ethoxylated or propoxylated $(C_1-C_{10})$alkylamine, $(C_2-C_{10})$alkylenediamine, triamine or tetraamine.

12. A developer concentrate as claimed in claim 11, wherein the amount of the N-alkoxylated, mono- or polyfunctional amines is from 0.2 to 20% by weight, based on the total weight of the concentrate.

13. A developer concentrate as claimed in claim 1, which contains aliphatic or aromatic alcohols, and nonionic surfactants.

14. A developer concentrate as claimed in claim 13, wherein the amount of the nonionic surfactants is from 0.1 to 20% by weight.

15. A method for preparing developer comprising:

diluting a concentrate as claimed in claim 1 with tap water in the ratio of from 1:0.5 to 1:10.

16. A method for the production of printing plates for lithographic, letterpress, gravure or screen printing and of photoresists, relief copies, tanned images or pigment images comprising employing a developer concentrate according to claim 1.

17. A developer prepared using a developer concentrate of claim 1.

18. A process for the production of a printing plate comprising:

applying a positive-working, negative-working or image reversal reproduction layer to a support, which is optionally mechanically and/or chemically and/or electrochemically pretreated and/or hydrophilized, and imagewise exposing said reproduction layer and then developing the exposed layer with a developer as claimed in claim 17.

19. A replenisher concentrate that is a developer concentrate as claimed in claim 1, wherein the concentration of the at least one agent which is alkaline in water in said replenisher concentrate is from 10 to 700%, higher than the concentration of said alkaline agent in said developer concentrate, and the concentrations of other components of said replenisher concentrate differ from those in the developer concentrate by up to 70%.

20. A replenisher which is prepared by diluting the concentrate as claimed in claim 19 with tap water in the ratio of from 1:0.5 to 1:10.

21. A developer prepared according to a process of claim 15.

22. The developer concentrate according to claim 1, further comprising an aliphatic or aromatic alcohol.

23. The developer concentrate according to claim 1, further comprising at least one nonionic surfactant.

24. The developer concentrate according to claim 22, wherein said concentrate includes an alcohol selected from the group consisting of $(C_1-C_{12})$alkanols, $(C_3-C_{20})$ alkoxyalkanols, unsubstituted or substituted phenol and benzyl alcohol.

25. The developer concentrate according to claim 23, wherein said nonionic surfactant is an alkoxylated, saturated or unsaturated aliphatic or aromatic alcohol.

26. The developer concentrate according to claim 25, wherein said alkoxylated nonionic surfactant is ethoxylated or propoxylated.

27. The developer concentrate according to claim 25, wherein said nonionic surfactant is present in an amount of from about 0.1 to about 20% by weight.

28. The developer concentrate according to claim 27, wherein said nonionic surfactant is present in an amount of from about from 0.5 to about 12% by weight.

29. The developer concentrate according to claim 1, wherein said concentrate further includes a cationic surfactant.

* * * * *